United States Patent
Chadalavda et al.

(10) Patent No.: US 10,281,524 B2
(45) Date of Patent: May 7, 2019

(54) TEST PARTITION EXTERNAL INPUT/OUTPUT INTERFACE CONTROL FOR TEST PARTITIONS IN A SEMICONDUCTOR

(71) Applicant: NVIDIA CORPORATION, Santa Clara, CA (US)

(72) Inventors: Sailendra Chadalavda, Milpitas, CA (US); Shantanu Sarangi, Saratoga, CA (US); Milind Sonawane, San Jose, CA (US); Amit Sanghani, San Jose, CA (US); Jonathon E. Colburn, Ben Lomond, CA (US); Dan Smith, Los Gatos, CA (US); Jue Wu, Los Gatos, CA (US); Mahmut Yilmaz, Los Altos Hills, CA (US)

(73) Assignee: NVIDIA CORPORATION, Santa Clara, CA (US)

(*) Notice: Subject to any disclaimer, the term of this patent is extended or adjusted under 35 U.S.C. 154(b) by 0 days.

(21) Appl. No.: 15/336,687

(22) Filed: Oct. 27, 2016

(65) Prior Publication Data
US 2017/0115338 A1 Apr. 27, 2017

Related U.S. Application Data

(60) Provisional application No. 62/285,429, filed on Oct. 27, 2015, provisional application No. 62/247,195, filed on Oct. 27, 2015.

(51) Int. Cl.
*G01R 31/3177* (2006.01)
*G01R 31/26* (2014.01)
(Continued)

(52) U.S. Cl.
CPC ..... *G01R 31/3177* (2013.01); *G01R 31/2607* (2013.01); *G01R 31/2803* (2013.01);
(Continued)

(58) Field of Classification Search
CPC .......... G01R 31/3177; G01R 31/31701; G01R 31/318555; G01R 31/31725;
(Continued)

(56) References Cited

U.S. PATENT DOCUMENTS 5,535,331 A 7/1996 Swoboda et al.
5,656,963 A 8/1997 Masleid et al.
(Continued)

*Primary Examiner* — Ajay Ojha

(57) ABSTRACT

In one embodiment, a test system comprises: a test partition configured to perform test operations; a centralized test controller for controlling testing by the test partition; and a test link interface controller configured to communicate between the centralized test controller and the test partition, wherein the test link interface controller controls dynamic changes to external pads associated with the test operations. The test link interface controller dynamically selects between an input direction and output direction for the external pads. The test link interface includes a pin direction controller that generates direction control signals based on the state of local test controller and communicates the desired direction to a boundary scan cell associated with the pin. The boundary scan cell programs the pad to either input or output direction depending on direction control signals. The input direction corresponds to driving test data and the output direction corresponds to observing test data.

12 Claims, 16 Drawing Sheets

(51) Int. Cl.
*G01R 31/317* (2006.01)
*G01R 31/28* (2006.01)
*G01R 31/3185* (2006.01)
*G06F 11/00* (2006.01)

(52) U.S. Cl.
CPC ..... *G01R 31/2806* (2013.01); *G01R 31/2834* (2013.01); *G01R 31/31701* (2013.01); *G01R 31/31707* (2013.01); *G01R 31/31724* (2013.01); *G01R 31/31725* (2013.01); *G01R 31/318555* (2013.01); *G01R 31/318572* (2013.01); *G06F 11/00* (2013.01)

(58) Field of Classification Search
CPC ...... G01R 31/31707; G01R 31/318572; G01R 31/2806; G01R 31/2803; G01R 31/31724; G01R 31/2834; G06F 11/00
See application file for complete search history.

(56) References Cited

U.S. PATENT DOCUMENTS

| | | | |
|---|---|---|---|
| 5,805,608 | A | 9/1998 | Baeg et al. |
| 5,812,562 | A | 9/1998 | Baeg |
| 5,970,241 | A | 10/1999 | Deao et al. |
| 6,016,555 | A | 1/2000 | Deao et al. |
| 6,055,649 | A | 4/2000 | Deao et al. |
| 6,065,106 | A | 5/2000 | Deao et al. |
| 6,081,885 | A | 6/2000 | Deao et al. |
| 6,106,568 | A | 8/2000 | Beausang et al. |
| 6,112,298 | A | 8/2000 | Deao et al. |
| 6,192,092 | B1 | 2/2001 | Dizon et al. |
| 6,343,365 | B1 | 1/2002 | Matsuzawa et al. |
| 6,473,439 | B1 | 10/2002 | Zerbe et al. |
| 6,586,921 | B1 | 7/2003 | Sunter |
| 6,622,255 | B1 | 9/2003 | Kurd et al. |
| 6,724,328 | B1 | 4/2004 | Lui et al. |
| 6,763,485 | B2 | 7/2004 | Whetsel |
| 6,813,739 | B1 | 11/2004 | Grannis, III |
| 6,949,958 | B2 | 9/2005 | Zerbe et al. |
| 7,015,741 | B2 | 3/2006 | Tschanz et al. |
| 7,046,174 | B1 | 5/2006 | Lui et al. |
| 7,093,150 | B1 | 8/2006 | Norman et al. |
| 7,245,684 | B2 | 7/2007 | Adkisson |
| 7,288,973 | B2 | 10/2007 | Zerbe et al. |
| 7,409,612 | B2 | 8/2008 | Van De Logt et al. |
| 7,447,961 | B2 | 11/2008 | Tan |
| 7,509,549 | B2 | 3/2009 | Larson et al. |
| 7,613,967 | B1 | 11/2009 | Tan |
| 7,831,856 | B1 | 11/2010 | Liu et al. |
| 7,984,369 | B2 | 7/2011 | Sul et al. |
| 7,987,401 | B2 | 7/2011 | Pandey |
| 8,112,654 | B2 | 2/2012 | Bjerregaard |
| 8,205,182 | B1 | 6/2012 | Zlatanovici et al. |
| 8,438,437 | B2 | 5/2013 | Jain et al. |
| 8,694,844 | B2 | 4/2014 | Whetsel |
| 8,887,117 | B1 | 11/2014 | Chuang |
| 9,103,879 | B2 | 8/2015 | Douskey et al. |
| 9,116,205 | B2 | 8/2015 | Douskey et al. |
| 9,459,651 | B2 | 10/2016 | Moheban et al. |
| 9,529,044 | B1 | 12/2016 | Taneja et al. |
| 9,733,308 | B2 | 8/2017 | Whetsel |
| 2002/0162063 | A1* | 10/2002 | Whetsel ......... G01B 31/318555 714/724 |
| 2002/0196886 | A1 | 12/2002 | Adkisson |
| 2002/0199124 | A1 | 12/2002 | Adkisson |
| 2003/0053489 | A1 | 3/2003 | Zerbe et al. |
| 2003/0229834 | A1 | 12/2003 | Cooke |
| 2004/0190665 | A1 | 9/2004 | Uratani et al. |
| 2005/0055617 | A1* | 3/2005 | Wang ............ G01R 31/318335 714/727 |
| 2005/0102643 | A1 | 5/2005 | Hou et al. |
| 2005/0234674 | A1 | 10/2005 | Bundy et al. |
| 2005/0242836 | A1 | 11/2005 | Goetting et al. |
| 2005/0262492 | A1 | 11/2005 | Goetting et al. |
| 2006/0022724 | A1 | 2/2006 | Zerbe et al. |
| 2006/0026473 | A1 | 2/2006 | Patrick Tan |
| 2006/0095818 | A1 | 5/2006 | Bratt et al. |
| 2006/0149987 | A1 | 7/2006 | Klowden et al. |
| 2007/0106923 | A1 | 5/2007 | Aitken et al. |
| 2008/0008015 | A1 | 1/2008 | Darbinyan et al. |
| 2008/0034334 | A1* | 2/2008 | Laouamri ...... G01B 31/318505 716/136 |
| 2008/0046770 | A1 | 2/2008 | Jong et al. |
| 2008/0276116 | A1 | 11/2008 | Bjerregaard |
| 2009/0150709 | A1 | 6/2009 | Arnold et al. |
| 2009/0184735 | A1 | 7/2009 | Wicki et al. |
| 2010/0223519 | A1 | 9/2010 | Swoboda |
| 2010/0235698 | A1 | 9/2010 | Diewald et al. |
| 2011/0099442 | A1 | 4/2011 | Hales et al. |
| 2011/0221469 | A1 | 9/2011 | Schlagenhaft |
| 2012/0117436 | A1 | 5/2012 | Portolan et al. |
| 2013/0159800 | A1 | 6/2013 | Ravi et al. |
| 2013/0194016 | A1 | 8/2013 | Wimer |
| 2014/0089750 | A1 | 3/2014 | Douskey et al. |
| 2014/0247080 | A1 | 9/2014 | Moheban et al. |
| 2014/0292385 | A1 | 10/2014 | Bahl et al. |
| 2014/0298125 | A1 | 10/2014 | Devadze et al. |
| 2015/0046763 | A1 | 2/2015 | Makar |
| 2015/0178102 | A1 | 6/2015 | Regner et al. |
| 2015/0220470 | A1 | 8/2015 | Chen et al. |
| 2016/0070619 | A1 | 3/2016 | Moran et al. |
| 2017/0115345 | A1 | 4/2017 | Sonawane et al. |
| 2017/0115346 | A1 | 4/2017 | Sonawane et al. |
| 2017/0115351 | A1 | 4/2017 | Datla Jagannadha et al. |
| 2017/0115352 | A1 | 4/2017 | Jayaraman et al. |
| 2017/0115353 | A1 | 4/2017 | Sonawane et al. |
| 2017/0133070 | A1 | 5/2017 | Ware et al. |
| 2017/0205465 | A1 | 7/2017 | Sarangi et al. |
| 2017/0269145 | A1* | 9/2017 | Whetsel ............ G01R 31/2607 |
| 2018/0122444 | A1 | 5/2018 | Ware et al. |

* cited by examiner

700

710
Receiving information regarding testing characteristics.

720
Analyzing the information regarding the testing characteristics.

730
Controlling a direction of information communication on a set of external pads in accordance with the analysis of the testing characteristics.

Fig. 7

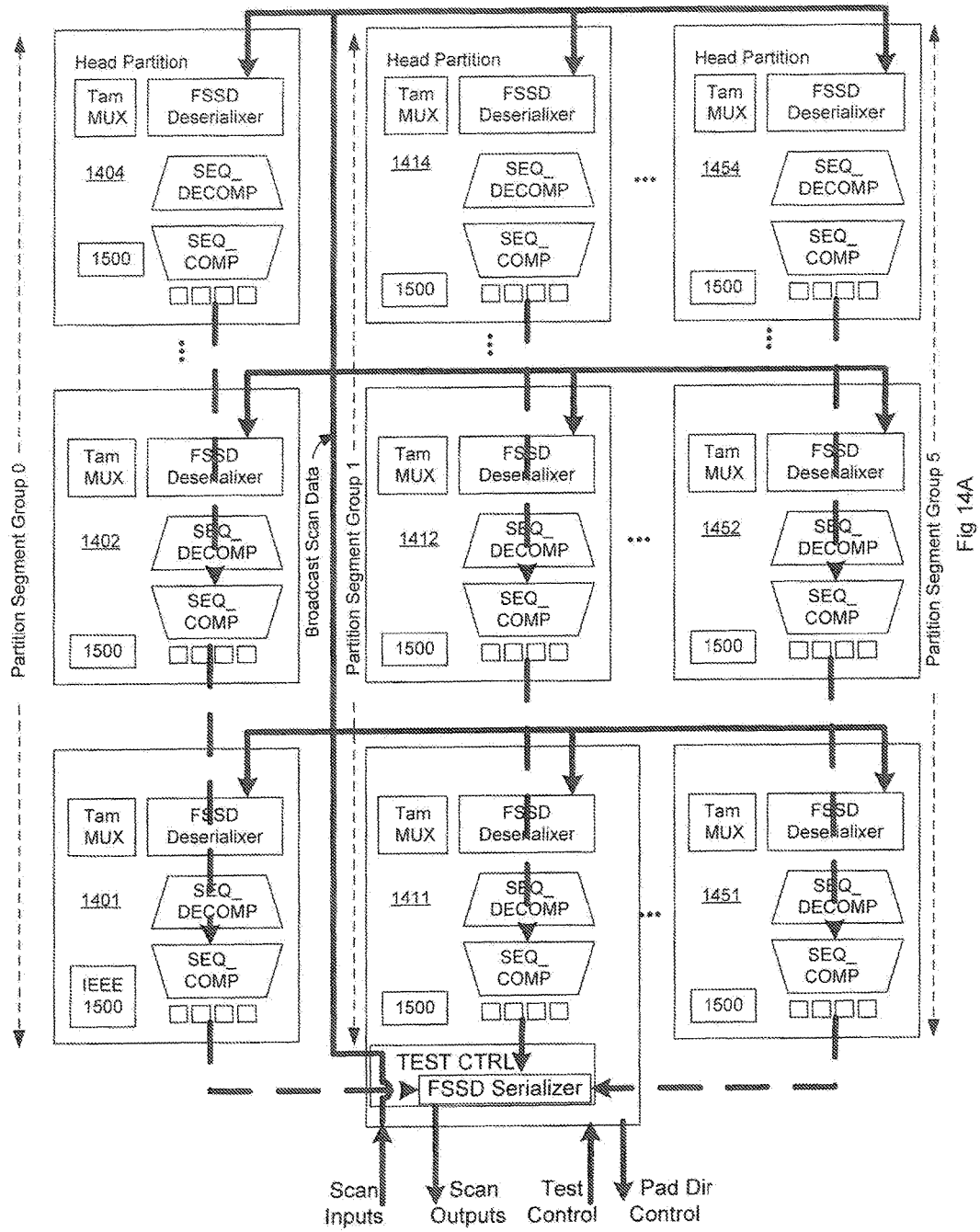

TEST PARTITION EXTERNAL INPUT/OUTPUT INTERFACE CONTROL FOR TEST PARTITIONS IN A SEMICONDUCTOR

RELATED APPLICATIONS

This application claims priority to and the benefit of following applications:

U.S. Provisional Application Ser. No. 62/247,195, filed on Oct. 27, 2015, entitled "SCANS SYSTEMS AND METHODS"; and U.S. Provisional Application Ser. No. 62/285,429, filed on Oct. 27, 2015, entitled "SCANS SYSTEMS AND METHODS";

which are all hereby incorporated by reference in their entirety for all intents and purposes.

FIELD OF THE INVENTION

The present invention relates to the field of circuit testing. In one embodiment, a test link input/output interface facilitates standardization of interface characteristics and conservation of pin resources.

BACKGROUND OF THE INVENTION

Numerous electronic technologies such as digital computers, video equipment, and telephone systems have facilitated increased productivity and reduced costs in processing information in most areas of business, science, and entertainment. Testing the components is typically an important activity in ensuring proper performance and accurate results. The testing of semiconductor devices often involves performing test operations in accordance with controls referred to as test patterns. Execution of the test patterns typically involves loading and unloading scan chains with test vectors. However, there are a number of factors that can impact testing and traditional testing approaches are often costly and inefficient.

A system on chip (SoC) design is typically composed of several blocks of circuitry, some of which may have similar designs that are used or replicated in different parts of the chips. The several blocks of circuitry are often configured or organized in test blocks or test partitions for purposes of testing the circuitry. Traditional approaches to generating a full set of conventional test patterns targeted at multiple test partitions and executing the test patterns at substantially similar or parallel times is computationally intensive and time consuming. These conventional attempts are often unable to meet limited cost budgets and constrained project schedules.

Design for test (DFT) methodologies have attempted to adapt to the new ecosystem by directing testing techniques to the SoC environment. One goal of many DFT methodologies is to be able to reuse circuit block designs and test patterns from chip to chip. However, traditional scan-test interfaces are usually tightly associated with the design and in a number of cases a derivative chip may have fewer pins available (e.g., based on the target markets, etc.) and non-standard interfaces. The non-standardized scan interfaces and varying pin configurations within and across traditional SoCs can be major impediments to reuse of circuit block designs and test patterns. The interface and pin count differences between chips traditionally means an extensive update and design change is required (causing additional costs and schedule delays in the design cycle). The limited available pads per circuit block for testing can prevent or reduce use of low cost multi-site testing and 3D stacked integrated circuits.

SUMMARY

In one embodiment, a test system comprises: a test partition configured to perform test operations; a centralized test controller for controlling testing by the test partition; and a test link interface controller configured to communicate between the centralized test controller and the test partition, wherein the test link interface controller controls dynamic changes to external pads associated with the test operations. The test link interface controller dynamically selects between an input direction and output direction for the external pads. The test link interface includes a pin direction controller that generates direction control signals based on the state of local test controller and communicates the desired direction to a boundary scan cell associated with the pin. The boundary scan cell programs the pad to either input or output direction depending on the direction control signals. The input direction corresponds to driving test data and the output direction corresponds to observing test data. The test control and test output connections are pipelined similarly so that test data and control are in sync and connections in the test link interface and external pads switch to an indicated direction by the time input/output data is ready. The test link interface is dedicated to a partition. Each IP included in the plurality of IP can be accessed independently and enables concurrent testing of multiple IPs.

In one embodiment, a test method comprises: communicating test information internally in accordance with a first set of test connections; communicating test information externally in accordance with a second set of test connections; and converting between signals on the a first set of test connections and signals on the a second set of test connections, wherein the converting comprises controlling dynamic changes to external pads associated with test operations. The converting enables circuit design and test pattern reuse. A test link interface performs the converting. A standard and consistent design for multiple circuit designs. The converting enables reduced pin count test, which can be very helpful for 2.5D and 3D chips. The converting enables multi-site testing, Handles TSV pin limitations (advanced testing). The converting enables various types of test controls in addition to sequential scan compression during engineering debug, as well production test facilitates Dynamic Standard Test Access with flexible bandwidth.

In one embodiment, a system comprises: a plurality of functional components arranged in physical partitions; a plurality of scan test chains configured to perform testing of the plurality of functional components, wherein plurality of scan test chains utilize a first set of test signal connections; a centralized test controller for controlling testing by the scan test chains; and a test link interface configured to communicate with the centralized test controller via external scan inputs at a second set of test signal connections, wherein the second set of test signal connection is less than the first set of test signal connections. The connections are implemented in RTL as they are predetermined and decoupled from the IP enabling early verification. An IO subsystem of the test link interface is dedicated to an IP included in a plurality of IP. Each IP included in the plurality of IP can be accessed independently and enables concurrent testing of multiple IPs. The fast interface includes single pin control per IP with pipeline and Dynamic Standard Test Access. The test link interface is a standard and consistent interface for IPs across chips.

DESCRIPTION OF THE DRAWINGS

The accompanying drawings, which are incorporated in and form a part of this specification, are included for exemplary illustration of the principles of the present invention and not intended to limit the present invention to the particular implementations illustrated therein. The drawings are not to scale unless otherwise specifically indicated.

FIG. 7 is a block diagram an exemplary test link I/O interface method in accordance with one embodiment.

FIG. 14A is a block diagram of an exemplary use of FSSD modules at varying test partition levels in accordance with one embodiment.

DETAILED DESCRIPTION

Figure 1:
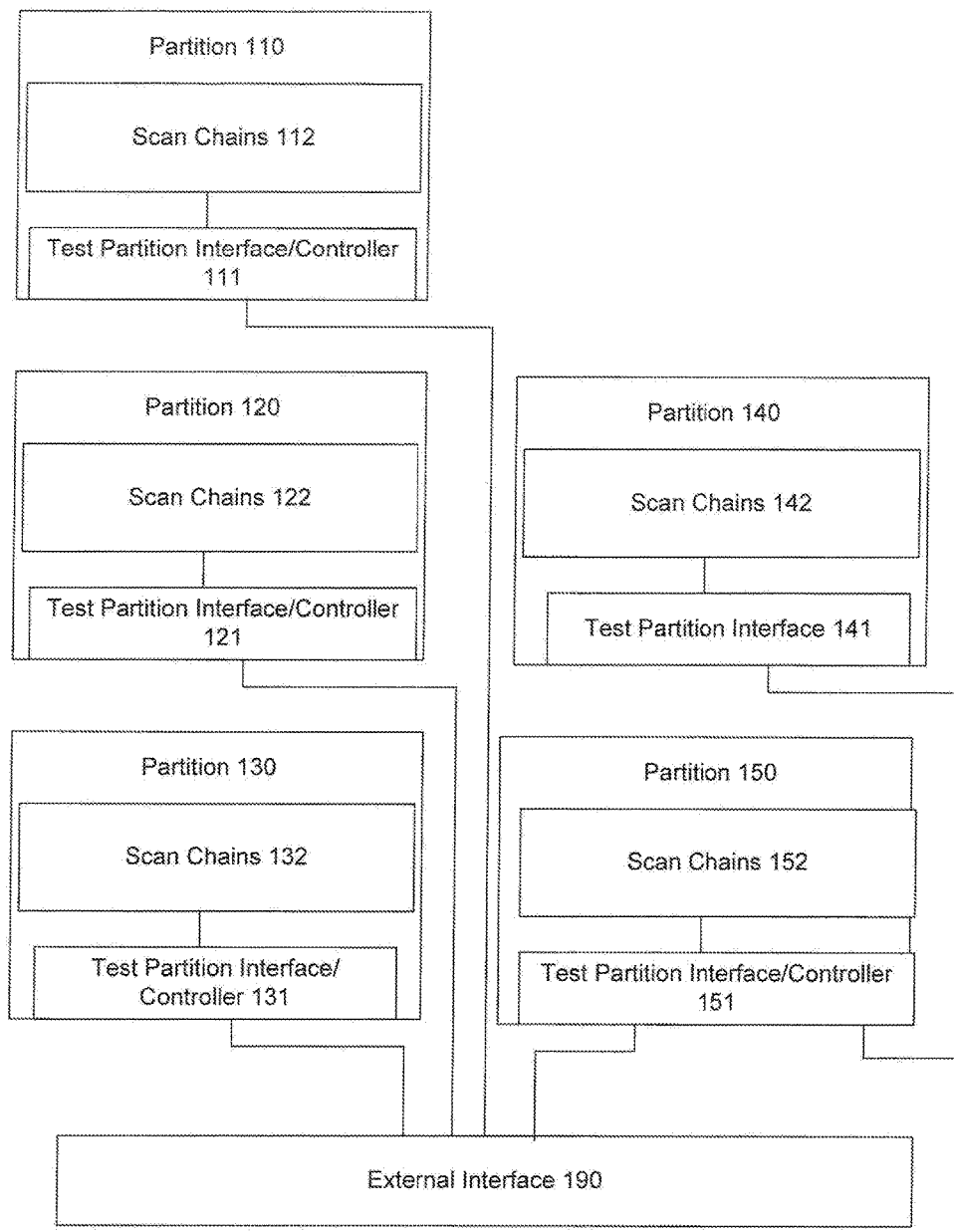
FIG. 1 is an exemplary block diagram of test system in accordance with one embodiment.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one ordinarily skilled in the art that the present invention may be practiced without these specific details. In other instances, well known methods, procedures, components, and circuits have not been described in detail as not to unnecessarily obscure aspects of the current invention.

Test Link I/O Overview

Test I/O interface systems and methods facilitate efficient and effective communication of information from pins to internal test partitions. In one embodiment, the test I/O interface comprises an internal dedicated standardized set of "test input", "test output" and "test control" connections or wires per test partition. The internal connections are coupled to the chip pins via a boundary scan cell design and "pin direction controller". In one exemplary implementation with a compatible test architecture and test I/O subsystem, the same set of chip pins can be used for "test input" and "test output". Using the same pins for input and output eliminates the need for dedicated input pins and dedicated output pins, thereby reducing the pin requirement by half over traditional designs.

In one embodiment, a boundary scan cell is modified to facilitate dynamic changes in direction of the communication on the pins. In one exemplary implementation, a pin direction controller generates direction control signals based on the state of test controller. The desired direction is communicated to the boundary scan cell of the associated pin via test control wires in the test I/O link. The boundary scan cell programs the pad to the desired direction. In one embodiment, the selection of either input or output depends on whether there is a desire to drive test data or observe test data. In one exemplary implementation, the "test control" and "test output" wires are pipelined identically so that test data and control are in sync and the pins switch to desired direction by the time input/output data is ready. Links can be implemented in RTL as they are predetermined and decoupled from the test partition enabling early verification.

Partition Testing Approach

In one embodiment, circuits under test in a System On a Chip (SOC) design are configured or organized into a hierarchy of groups or sets of circuitry. A functional circuit and associated test circuitry are organized into test units or cells. The test units are coupled together into scan chains and the scan chains are configured or organized into test partitions or test blocks. The test partitions and components therein can be organized based on a variety of factors (e.g., components involved in a type of function, particular design of the circuitry, intellectual property, size, portion of die area, number of functional components, electrical characteristics, safety limitations, power consumption, etc.).

While the organization of test operations based upon test partitions does offer greater testing granularity, the increased number of test partitions and the many possible different test characteristics and features of the test partitions gives rise to very complex and complicated test environments. The presented granular dynamic testing systems and methods are configured to facilitate testing of the different complex characteristics and factors associated with the multiple test partitions in an efficient and effective manner.

FIG. 1 is a block diagram of test system 100 in accordance with one embodiment. Test system 100 includes test partition 110, test partition 120, test partition 130, test partition 140, test partition 150 and external interface 190. Test partitions 110, 120, 130,140, and 150 include scan chains 112, 122, 132, 142, and 152 respectively. Test partitions 110, 120, 130, and 140 include test partition interfaces/controllers 111, 121, 131, and 141. In one embodiment, test partitions 140 and 150 are very similar and are considered to be similar IP or functionally equivalent. As such, the test partition interface/controller 141 can be considered to provide control operations for test partition 150 via test partition interface 151. In one embodiment, test partition interface/controller 141 is considered a centralized controller for both test partition 140 and test partition 150. Test partition interface 151 can be less complex than test partition interface/controller 141 (e.g., interface 151 has less controls and is considered an interface rather than interface/controller). It is appreciated that test system 100 can have a variety of configurations. In one embodiment, there are some test interface and control operations that can be performed by a centralized controller even if the partitions are not similar (e.g., do not have same IP, are not functionally similar, etc.).

Figure 2:
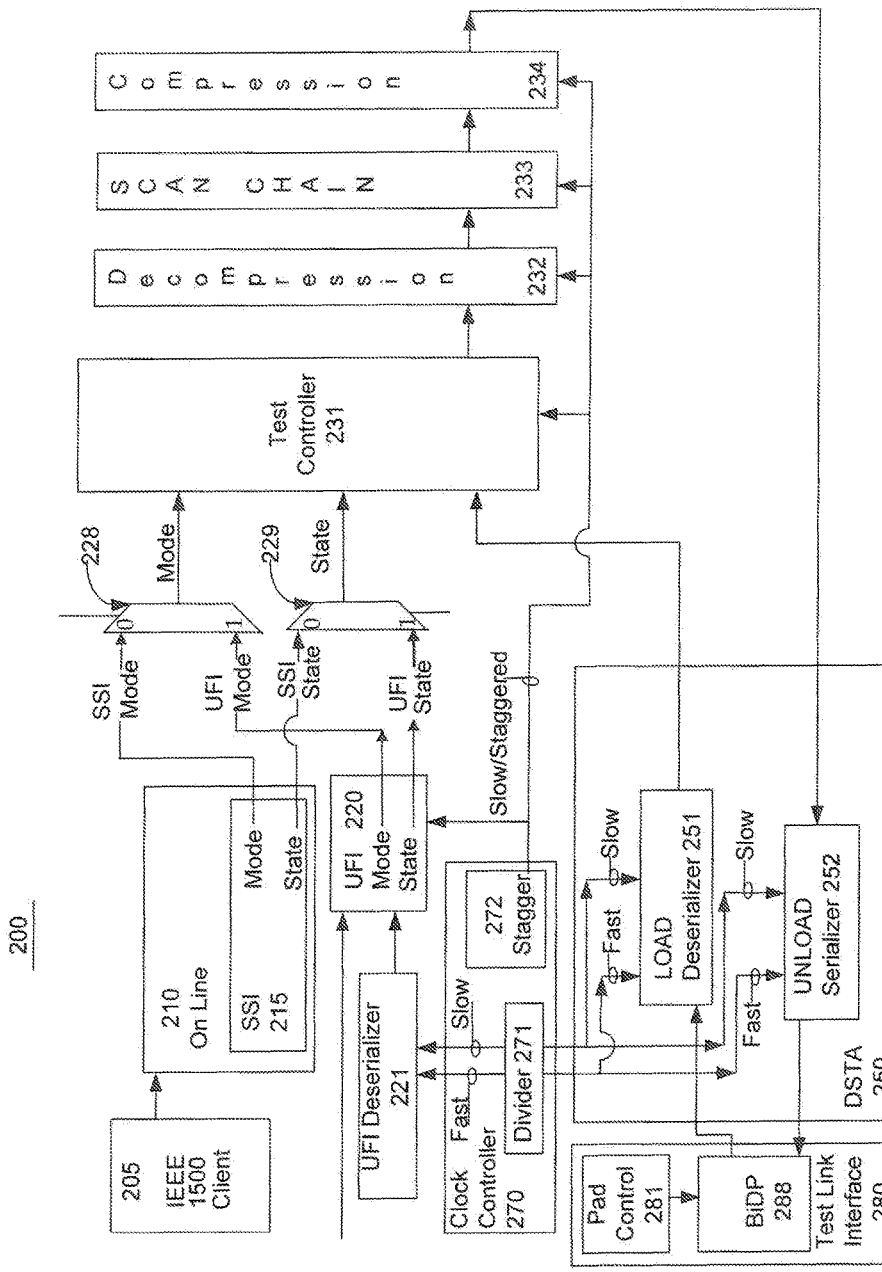
FIG. 2 is an exemplary block diagram of an exemplary system in accordance with one embodiment.

FIG. 2 is a block diagram of an exemplary system 200 in accordance with one embodiment. System 200 can operate as a test partition interface/controller. In one exemplary implementation, system 200 is similar to a test interface/controller 111 or 121. System 200 includes IEEE 1500 client interface 205, On Line module 210, Ultra Fast Interface (UFI) controller 220, UFI de-serializer 221, mode MUX 228, State MUX 229, Test Controller 231, Scan Decompression Component 232, Scan Chain Component 233, Scan Compression Component 234, Dynamic Scan Test Access (DSTA) Component 250, Clock Controller 270 and Test Link Interface 280 and Bi-Directional Pads 288. Mode MUX 228 and State MUX 229 are coupled to Test Controller 231, Ultra Fast Interface (UFI) controller 220 and On Line module 210 which is coupled to IEEE 1500 client interface 205. UFI 220 is coupled to UFI de-serializer 221. Clock controller 270 is coupled to Ultra Fast Interface (UFI) controller 220, UFI de-serializer 221, Test Controller 231, Scan Decompression Component 232, Scan Chain Component 233, Scan Compression Component 234, and DSTA 250. DSTA 250 is coupled to Bi-Directional Pads 288 which are in Test Link Interface 280. On Line module 210 can include SSI 215. Clock Controller 270 can include divider 271 and stagger 272. DSTA 250 can include load component 251 and unload component 252.

In one embodiment, UFI de-serializer 221 receives an ultra fast serial signal and de-serializes the signal into separate signals that are forwarded to the UFI module 220. UFI module 220 generates UFI mode information and UFI state information which is fed into mode MUX 228 and State MUX 229 respectively. On Line module 210 receives signals from IEEE 1500 client interface 205 and generates SSI mode information and SSI state information which is fed into mode MUX 228 and State MUX 229 respectively. Mode MUX 228 selects either the UFI mode information or SSI mode information and forwards the selected information to Test Controller 231. State MUX 229 selects either the UFI state information or SSI state information and forwards the selected information to Test Controller 231.

Test controller 231 organizes the test signals and forwards them to Scan Decompression Component 232. Scan Decompression Component 232 decompresses the signals and forwards them to Scan Chain Component 233. Scan Chain Component 233 performs the scan test operations (e.g., scan shift, scan capture, etc.) and forwards the results to Scan Compression Component 234. Scan Compression Component 234 compresses the test results and forwards the compressed test results to DSTA 250. DSTA 250 receives scan test input data from external connections of bi-directional pads 288 and forwards scan test output data to external connections of bi-directional pads 288. Test Link Interface 280 includes pad direction controller 281 that controls the communication direction of Bi-Directional Pads 288. Clock controller 270 generates clocks signals.

In one embodiment, the clock signals are coordinated in accordance with the rates of input and output signals of the various components. In one exemplary implementation, the Clock controller 270 receives a single free flowing clock input and generates a fast internal clock, a slow internal clock and a slow staggered internal clock. The fast internal clock and slow internal clock are forwarded to the UFI deserializer 221, LOAD deserializer 251, and UNLOAD serializer 252 for use in respective deserializing/serializing operations. The slow staggered internal clock is forwarded to Test Controller 231, Scan Decompression Component 232, Scan Chain Component 233 and Scan Compression Component 234 for clocking the test operations of the respective components.

Test Link I/O

Figure 3:
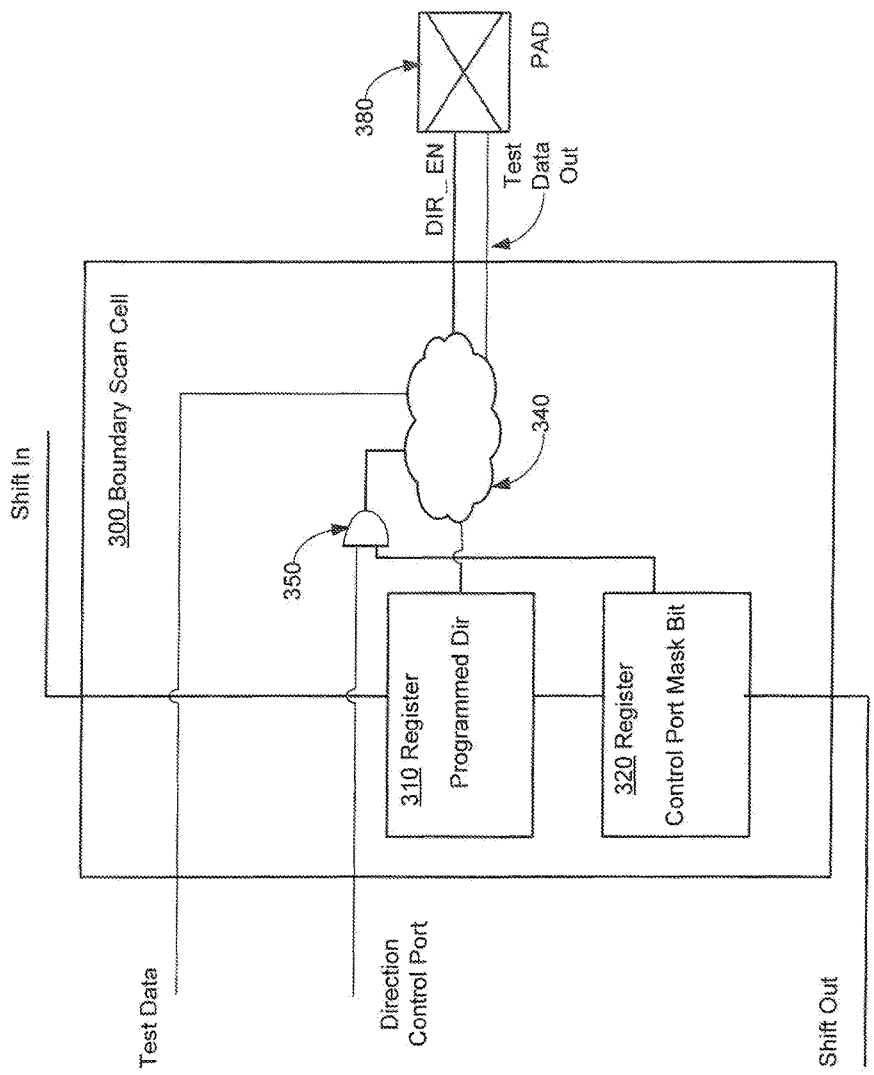
FIG. 3 is a block diagram of an exemplary simplified boundary scan cell in accordance with one embodiment.

FIG. 3 is a block diagram of an exemplary simplified boundary scan cell 300 in accordance with one embodiment. Boundary scan cell 300 includes direction program register 310, control port mask bit register 320, AND gate 350 and boundary logic 340. Boundary scan cell 300 is coupled to pad 380. The direction program register 310 and control port mask bit register 320 receive test shift input information and forward test shift output information. The direction program register 310 can also forward information to pad 380. The direction control port can receive direction control information from a pad direction controller (not shown) and forward it to AND gate 350.

Figure 4:
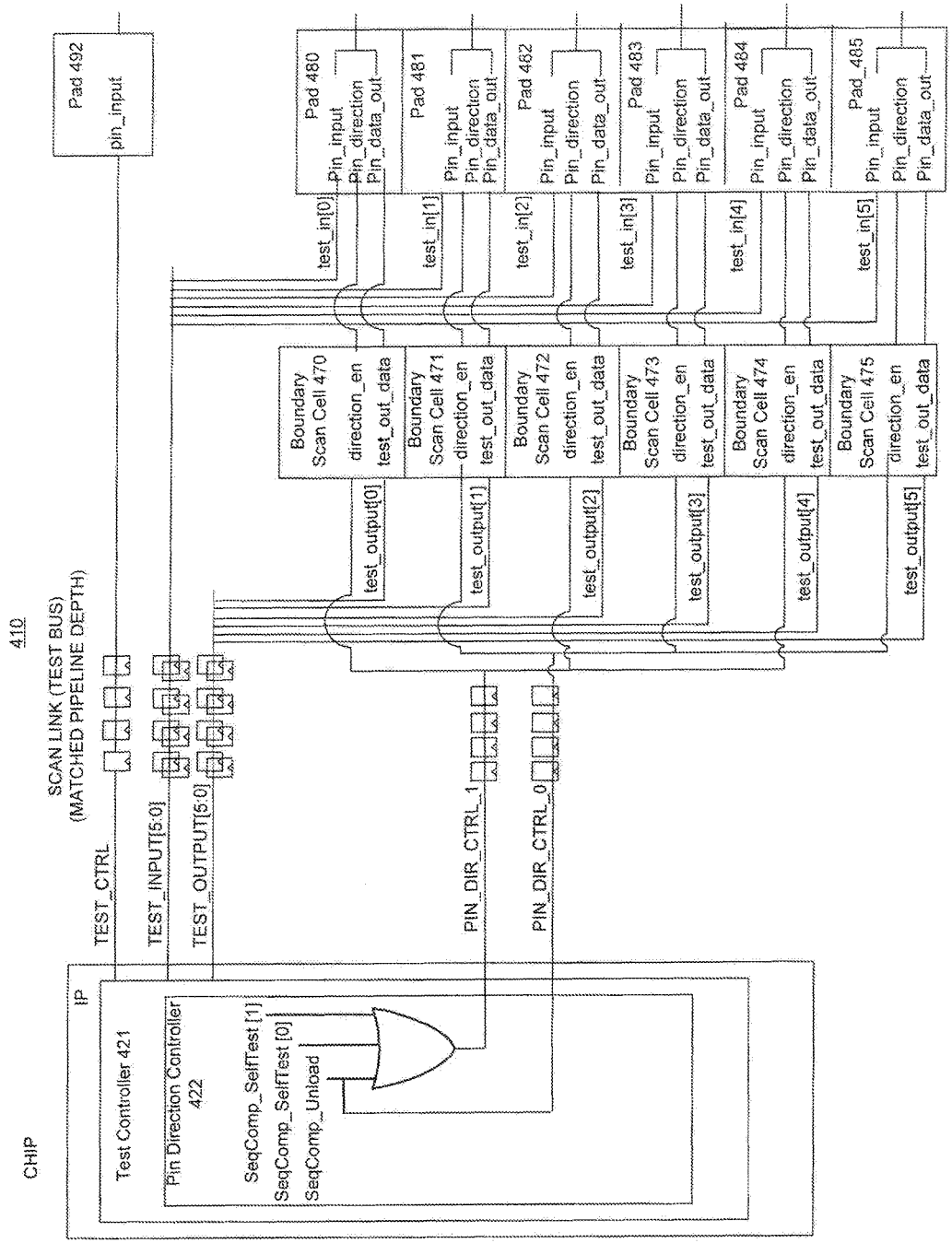
FIG. 4 is an exemplary block diagram illustrating an exemplary boundary scan cell interaction architecture in accordance with one embodiment.

FIG. 4 is a test partition diagram illustrating an exemplary boundary scan cell interaction architecture 410 in accordance with one embodiment. Boundary scan cell interaction architecture 410 includes test controller 421, boundary scan cells 470 through 475, and bidirectional pads 480 through 485 and test control pad 492. Test controller 421 includes pin direction controller 422 which controls the operation of the bidirectional pads 480 through 485 via boundary scan cells 470 through 475 as an input or output. In one embodiment, the pin direction controller 422 includes an logical OR of the sequential compression self test indicators and the sequential compression unload indicator. The pins or pads are set with a default input direction. The result of the OR is forwarded to the boundary scan cells 470, 472, 474 as the pin or pad direction change enable and the sequential compression unload indicator is forwarded to the boundary scan cells 471, 473, 475 474 as the pin or pad direction change enable. Pads 480 through 485 communicate the input directly to the test partition or the output from the test partition via respective boundary scan cells 470 through 475 based upon the pin direction enable from the via respective boundary scan cells 470 through 475.

Figure 5:
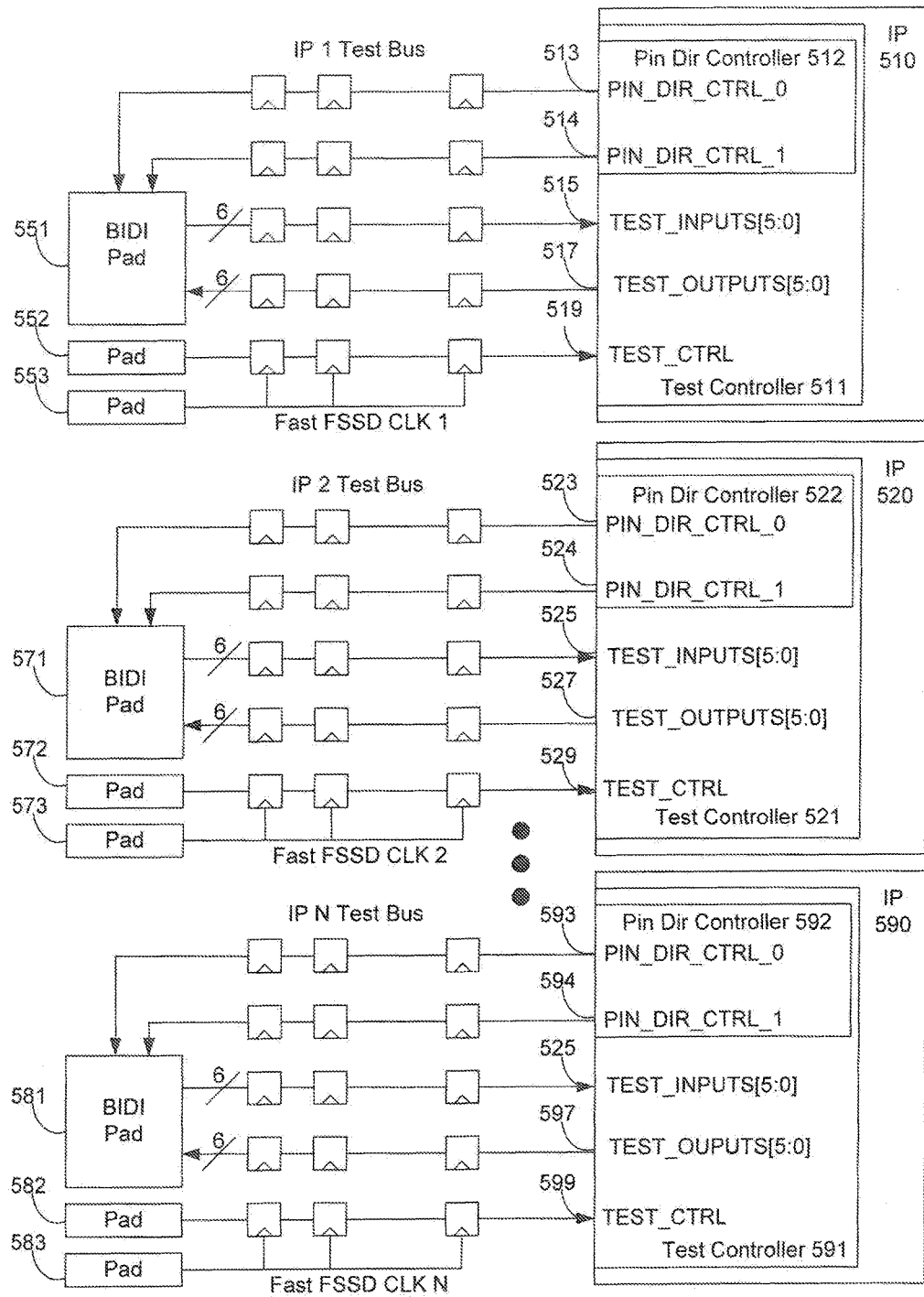
FIG. 5 shows an exemplary test link I/O interface scheme in accordance with one embodiment.

FIG. 5 shows an exemplary test link I/O interface scheme 500 in accordance with one embodiment. Test link I/O interface scheme 500 includes test partitions 510, 520, and 590 which include test controllers 511, 521, 591 respectively. A test controller (e.g., 511, 521, 591, etc.) includes a pin direction controller (e.g., 512, 522, 592, etc.) that controls the direction of communication on external bidirectional pads (e.g., 551, 571, 581 etc.). Pin direction controller (e.g., 512, 522, 592, etc.) generates a first direction pad control signal (e.g., 513, 523, 593, etc.) and a second pad direction control signal (e.g., 514, 524, 594, etc.). In one exemplary implementation, the first direction pad control signals indicate an output direction and the second direction pad control signals indicate an input direction. A pin test controller (e.g., 511, 521, 591, etc.) also includes test input connections (e.g., 515, 525, 595, etc.), test output connections (e.g., 517, 527, 597 etc.) and a test control connection (e.g., 519, 529, 599, etc.). The test input connections (e.g., 515, 525, etc.) and test output connections (e.g., 517, 527, etc.) are coupled to bi-directional pads (e.g., 551, 571, etc.). The test control pad is coupled to an external input pad (e.g., 552, 572, 573, etc.). A test clock signal is received on a clock pad (e.g., 553, 573, 593, etc.).

In one embodiment, a test link I/O interface with for a test partition with a fast scan serialer/deserializer (FSSD) has one test control pin and at least one bidirectional test data pin. In one exemplary implementation, the maximum number of pins that can be supported is based on FSSD ratios. If the chip has multiple test partitions, there can be a separate test link I/O interface for each test partition. A high level overview of one exemplary implementation of this scheme is shown in FIG. 5. As shown in FIG. 5, each test partition has its own test controller. The test control pin is used for driving a test partition level Finite State Machine (FSM) that controls the test mode. There are up to P number of bidirections (bidi) pads for each test partition, where P is the number of test input or test output pins at the test partition level. For FSSD compatibility, in one embodiment six test partition pins are used for test input and outputs. Depending on the available chip level pins, the number of bidi pads used for test data flow can be reduced down to one. The direction of bidi pads are controlled by the pin direction controller through a special boundary scan cell. The listed control and data signals together create the test bus. In one exemplary implementation, the test buses of a given test partition have the same number of pipeline flip-flops for signals that are clocked by the fast FSSD clock. Since each test partition is operated separately, pipeline depths are not required to be matched among different test partitions.

In one embodiment, the test link I/O interfaces are implemented in RTL as they are predetermined and decoupled from the test partition. This enables early verification. Furthermore, test link I/O interface IO subsystem together with FSSD enables reuse of test partition and pattern data between chips. If the number of available pads for a "reused" test partition is reduced, the test link I/O interface can have fewer test input/output wires routed to the test partition from pads. Unused ports for the test partition can be tied off inside the test link I/O interface, at the chip level. In one exemplary implementation, the test partition level interface does not change.

Test Link I/O Interface Pin Direction Controls

With a compatible test architecture and test link I/O interface, the same set of chip pins can be used for "test input" and "test output" eliminating the need for dedicated input and output pins. This reduces the pin requirement by half over previous designs. The boundary scan cell is enhanced to facilitate dynamic direction change of the pins. The pin direction controller generates direction control signals based on the state of test controller and communicates the desired direction to the boundary scan cell of the associated pin via test control wires in the link. These control wires then program the pad to the desired direction, either input or output depending on whether there is a need to drive test data or observe test data. The test control and test output wires are pipelined identically so that test data and control are in-sync and the pins switch to a desired direction by the time input/output data is ready.

Depending on the test compression scheme used, the functionality of each pad can be changed. In the Xtreme compression architecture (XTR), the pin configurations differ depending on the mode of operation. For instance, while unloading MISRs (misr_unload mode) the pads act as output, while loading seeds to LFSRs (reseed_load mode) the pads act as inputs, whereas during initial self-test of internal compression logic (codec_drc mode) only a few pads act as inputs and the remaining ones as output pads. In legacy scan (compression bypass) mode, half of pads can be used as input and half as output.

Figure 6:
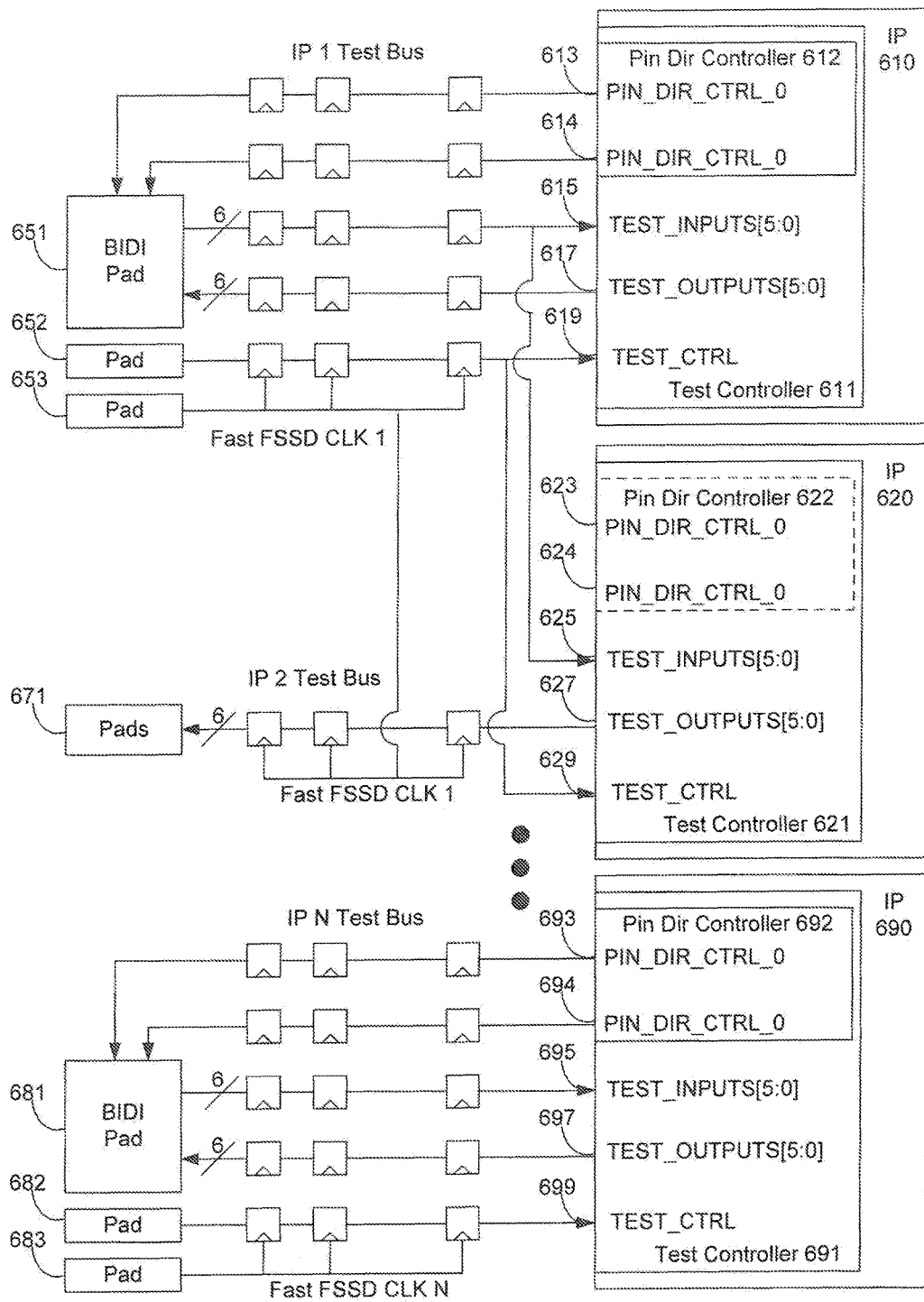
FIG. 6 is block diagram of an exemplary test link I/O interface scheme in accordance with one embodiment.

In one embodiment, test link I/O interface scheme 500 illustrated in FIG. 5 is considered a one to one test link I/O interface. FIG. 6 shows an exemplary test link I/O interface scheme 600 in accordance with one embodiment. In one embodiment, test link I/O interface scheme 600 illustrated in FIG. 6 is considered a broadcast test link I/O interface.

FIG. 6 shows an exemplary test link I/O interface scheme 600 in accordance with one embodiment. Test link I/O interface scheme 600 includes test partitions 610, 620, and 690 which include test controllers 611, 621, and 691 respectively. A test controller (e.g., 611, 691, etc.) includes a pin direction controller (e.g., 612, 692, etc.) that controls the direction of communication on external bidirectional pads (e.g., 651, 681 etc.). The test controllers 611 and 621 share the bidi pad 651 and whether test controller 621 includes circuitry associated with a pin direction controller 622 is optional. If test partition 620 includes the circuitry associated with the test pin controller 622 (e.g., for ease of keeping the test partition design consistent, etc.), associated with the test pin controller 622 is not coupled to bidi pad 651. Pin direction controller (e.g., 612, 622, 692, etc.) generate a first direction pad control signal (e.g., 613, 693. etc.) and a second direction pad control signal (e.g., 614, 693, etc.). In one exemplary implementation, the first direction pad control signals indicate an output direction and the second direction pad control signals indicate an input direction. A pin test controller (e.g., 611, 621, and 691 etc.) also includes test input connections (e.g., 615, 625, 695, etc.), test output connections (e.g., 617, 627, 697, etc.) and a test control connection (e.g., 619, 629, 699, etc.).

It is appreciated that the test inputs for multiple test partitions (e.g., 610, 620, etc.) can be communicated via pads that are shared by multiple test partitions or can be communicate via pads that are dedicated to a particular test partition. In one embodiment, bi-directional pad 651 is coupled to and shared by the respective test input connections 615 and 625. The test outputs for test partition 610 are communicated via bidi pads 651 and the test outputs for test partitions 620 are communicated via pads 671. In one exemplary implementation, the test control pads and test clock pads can be also shared between multiple test partitions or dedicated to a particular test partition. In one embodiment, test control pad 652 is coupled to and shared by the test partitions 610 and 610 respective test control connections 619 and 629. Similarly, test clock pad 653 communicates a clock signal that is shared by pipeline components associated with test partitions 610 and 620.

With respect to pads that are dedicated to a particular test partition, in one embodiment test controller 691 includes a pin direction controller 692 that controls the direction of communication on external bidirectional pads 681. Pin direction controller 692 generates a first direction pad control signal 693 and a second pad direction control signal 694. A pin test controller 691 also includes test input connections 695 and test output connections 697 and a test control connection 699. The test input connections 695 and test output connections 697 are coupled to bi-directional pads 681. The test control pad is coupled to an external input pad 683. A test clock signal is received on a clock pad 683.

FIG. 7 shows an exemplary test link I/O interface method 700 in accordance with one embodiment. In one exemplary implementation, changing direction of test link I/O interface pads enables facilitates various types of test controls in addition to sequential scan compression during engineering debug and production testing. The test link I/O interface method can also be implemented with flexible bandwidth Dynamic Standard Test Access configurations.

In block 710, information regarding testing characteristics is received. In one embodiment, the information includes an indication of a test mode (e.g., reseed load mode, MISR unload mode, codec DRC mode, legacy mode, etc).

In block 720, the information regarding the testing characteristics is analyzed. In one embodiment, the information is analyzed to determine a requisite or appropriate external pad configuration to enable scan test information to be communicated to a test partition. In one exemplary implementation, the analysis includes determining a particular direction (e.g., input, output, etc.) for configuring an external pad.

In block 730, the direction of information communication on a set of external pads is controlled in accordance with the analysis of the testing characteristics. In one embodiment, a test link interface controls the direction of information communication on an external pad. In one exemplary implementation, the test link interface is a standard and consistent design for multiple circuit designs. The test link interface can enable reduced pin count as compared to separate dedicated input pads and dedicated output pads. The test link interface can enable multi-site testing in accordance with TSV pin limitations.

In one embodiment, the test link interface facilitates communication of information in accordance with a granular dynamic test process. The granular dynamic test process includes: communicating test information internally in accordance with a first set of test connections; communicating the test information externally in accordance with a second set of test connections; and converting between signals on the first set of test connections and signals on the a second set of test connections, wherein the converting comprises controlling dynamic changes to the external pads. In one exemplary implementation, the converting facilitates circuit design and test pattern reuse.

In one embodiment. default direction of a scan pad is controlled by the boundary scan register. This register can be programmed during initial test setup cycles. To change the pad direction dynamically (e.g., depending on the mode of the test, etc.) a direction inversion control port is included in the boundary scan cell. In one exemplary implementation, the programmed direction gets inverted when the control port of boundary scan cell is set to 1.

Pad direction can be set in accordance with different modes of transmission (XTR). In one embodiment, the modes and corresponding pad directions are set forth in the following Table:

| Mode | Pad Directions |
| --- | --- |
| Misr_load | All output |
| Codec-drc | 1 input/1 output, or 3 input/3 output |
| Reseed_load | All Input |

In order to achieve the configurations required for a scan test described in the table, the scan pads are programmed to act as input in scan compression test setup cycles. When the test controller detects that the mode is misr_unload, it asserts the control port of boundary scan cell to 1 and flips the direction of the pads to outputs. For modes that require some pads to be inputs and some to be outputs, the control signals of pads that should be in output mode get asserted to 1 while others retain their programmed direction (e.g., input, etc.).

For compression bypass ATPG mode, the control port of boundary scan cell is masked off by programming another boundary scan cell and the direction inversion feature is disabled. In one embodiment, dedicated input and output pads are used as chains and are loaded and unloaded simultaneously. The pads can be programmed accordingly during test setup.

It is appreciated a test partition can operate in various pin configurations. The various pin configurations in which a test partition can operate in accordance with one exemplary implementation are summarized in the following table.

| Pads Available | XTR MODE (eserdes ratio) | LEGACY MODE (eserdes ratio) | Pad Configuration per IP |
| --- | --- | --- | --- |
| 6 | 4X | 8X | XTR: All 6 input or output depending on the mode. Legacy: 3 in/3 out |
| 4 | 6X | 12X | XTR: All 4 input or output depending on the mode. Legacy: 2 in/2 out |
| 3 | 8X | 24X | XTR: All 3 input or output depending on the mode. Legacy: 1 in/1 out |
| 2 | 12X | 24X | XTR: All 2 input or output depending on the mode. Legacy: 1 in/1 out |

In one embodiment, test Access Mechanism Configuration Multiplexor (TAM_MUX) modules enable a test partition to work with a range of test link I/O interface configurations. TAM_MUX houses various configuration multiplexors that work with FSSD modules and enable the test partition to operate under different pin configurations. This lets the test partition be designed once and reused in different SoC configurations. FIGS. 8 through 13 give a high level overview of the interaction between the test link I/O interface, TAM_MUX and FSSD modules in various configurations tabulated in Table 3. In FIGS. 8 through 13, the solid bold lines indicate an input flow and the dashed bold lines indicated an output flow.

Figure 8:
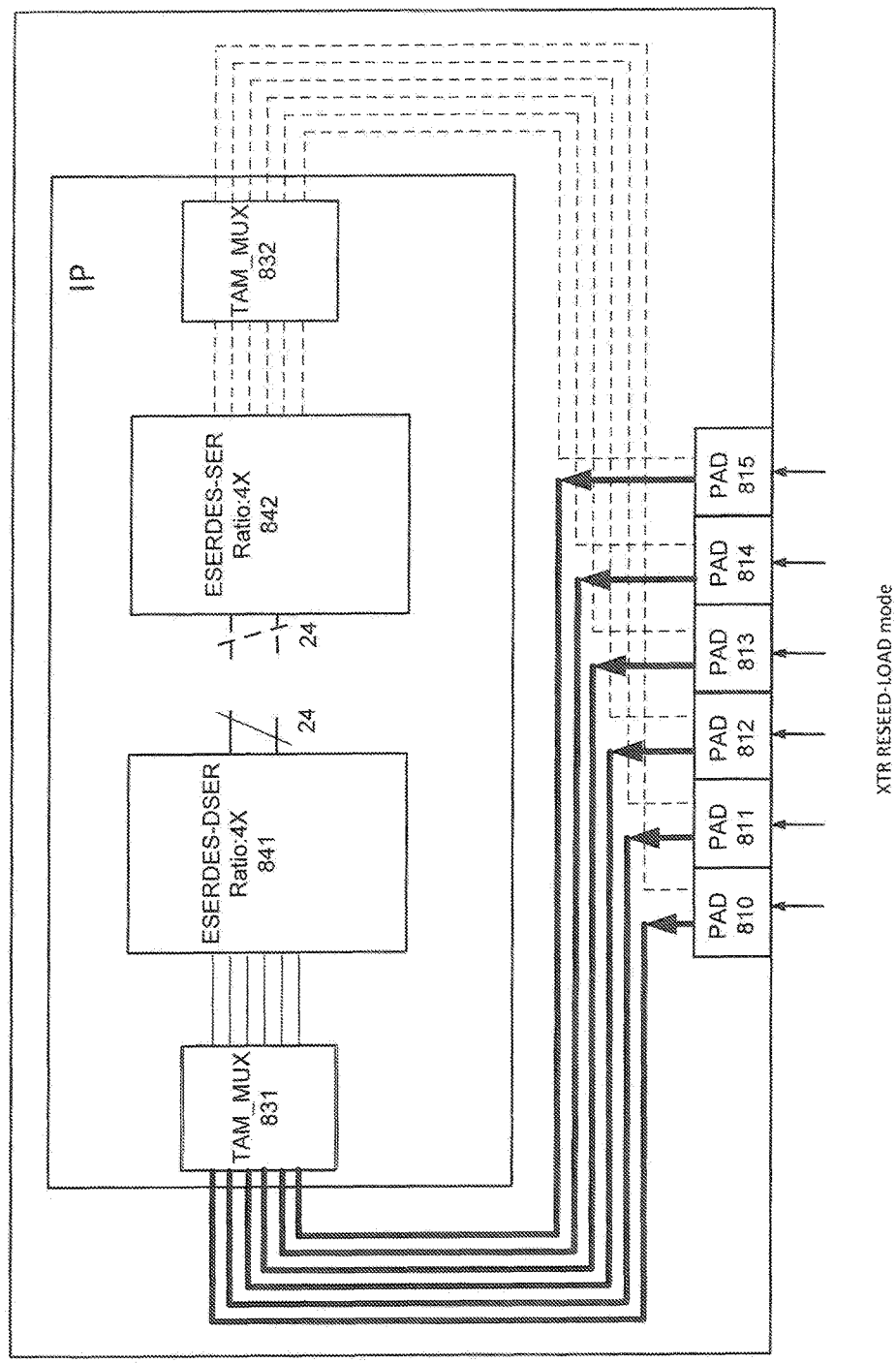
FIG. 8 is a block diagram of an exemplary XTR RESEED-LOAD mode pin transmission direction in accordance with one embodiment.

FIG. 8 shows how the test partition level test controller changes pin directions dynamically. FIG. 8 is a test partition diagram of XTR RESEED-LOAD mode pin transmission directions in accordance with one embodiment. In one embodiment, the load associated pads are transmitting information in the input direction. In one exemplary implementation, pads 810, 811, 812, 813, 814 and 815 are transmitting in an input direction.

Figure 9:
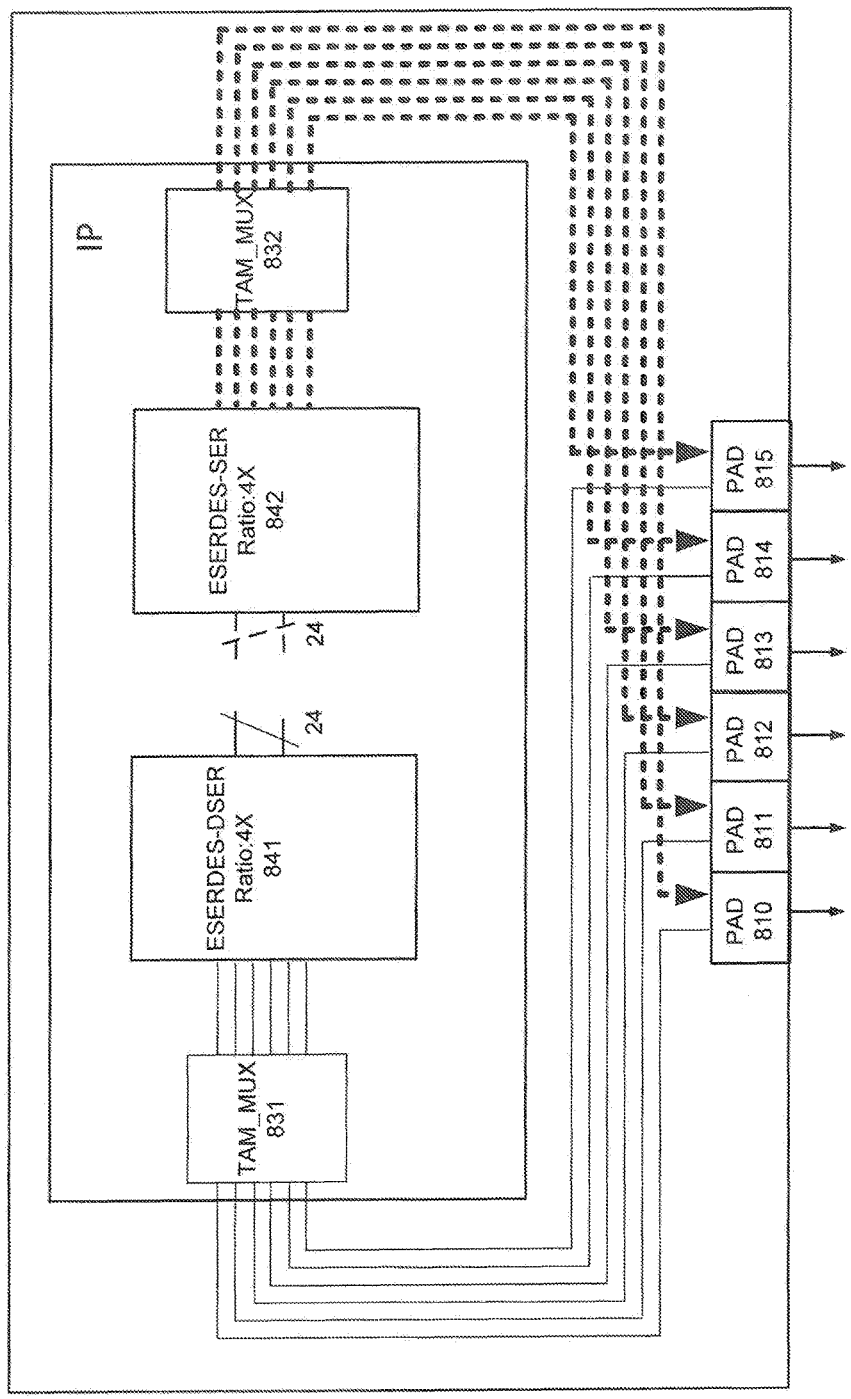
FIG. 9 is a block diagram of an exemplary XTR MISR-UNLOAD mode pin transmission direction in accordance with one embodiment.

FIG. 9 is a test partition diagram of XTR MISR-UNLOAD mode pin transmission direction in accordance with one embodiment. In one embodiment, the unload associated pads are transmitting information in the output direction. In one exemplary implementation, pads 810, 811, 812, 813, 814 and 815 are transmitting in an output direction.

Figure 10:
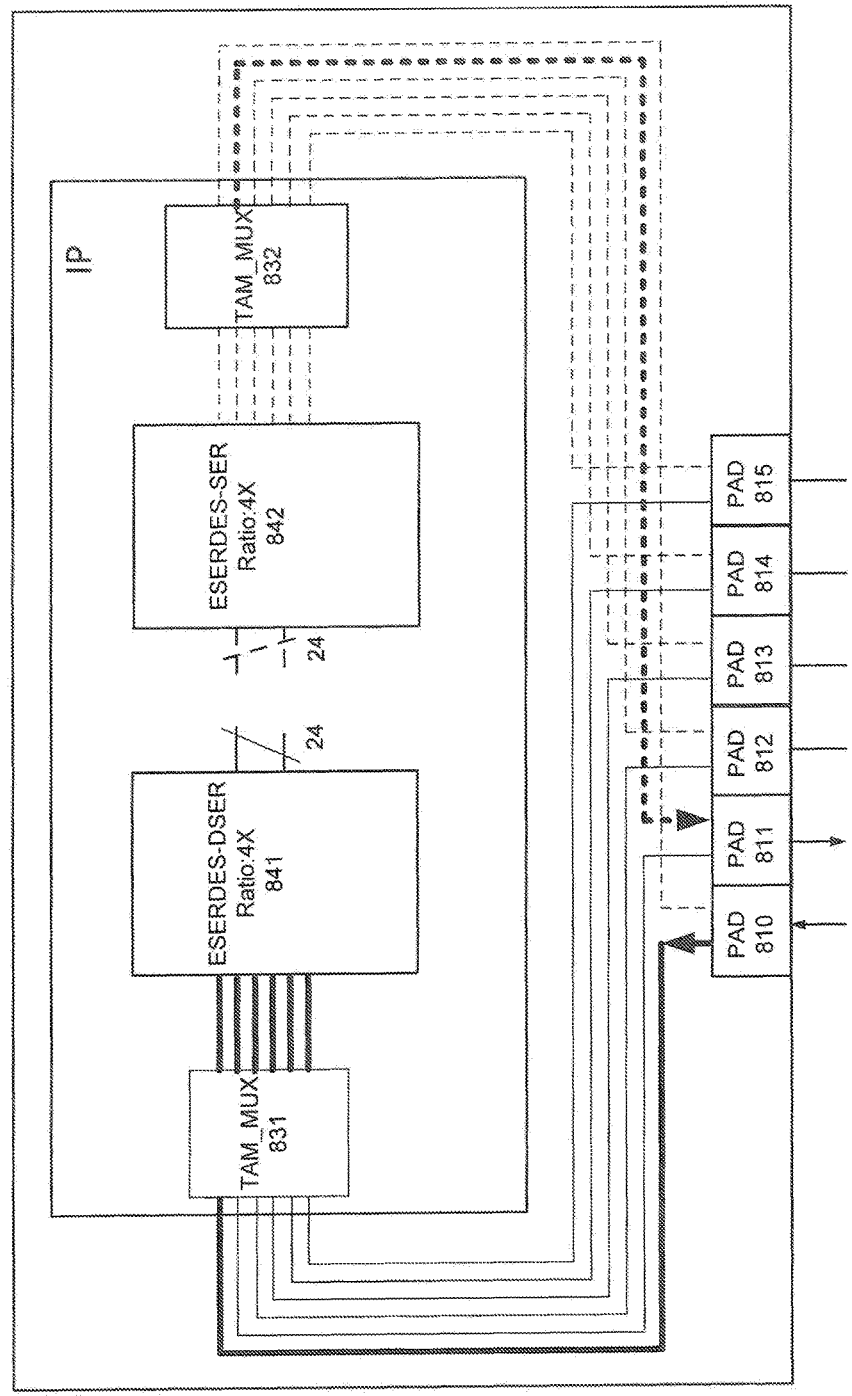
FIG. 10 is a block diagram of an exemplary XTR CODEC-DRC mode pin transmission direction in accordance with one embodiment.

FIG. 10 is a test partition diagram of XTR CODEC-DRC mode pin transmission direction in accordance with one embodiment. In one embodiment, some of the pads are transmitting in put input direction and some of the pads are transmitting in the output direction. In one exemplary implementation, one pad (e.g., pad 810) is inputting information and one pad (e.g., 820) is outputting information.

Figure 11:
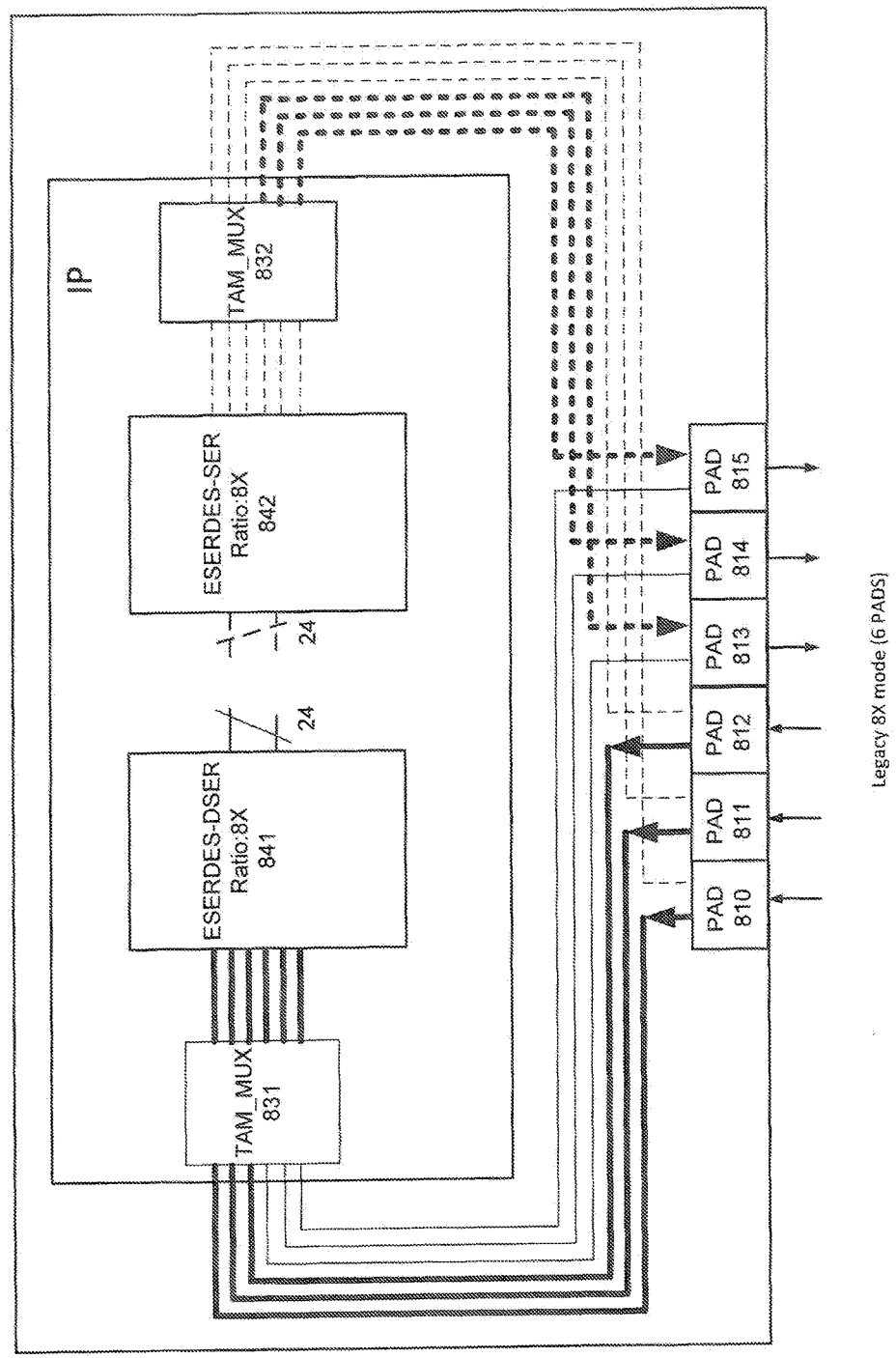
FIG. 11 is a block diagram of an exemplary Legacy 8× mode (6 PADS) pin transmission direction in accordance with one embodiment.

In the legacy scan chain mode, the scan compression logic, (e.g., LFSRs, MISRs, etc.) are bypassed. FIG. 11 is a test partition diagram of a legacy 8× scan mode pin transmissions directions in accordance with one embodiment with 6 pads available. The scan interface in the legacy 8× scan mode uses an 8×FSSD bandwidth ratio. In one embodiment, some of the pads are transmitting in an input direction and some of the pads are transmitting in an output direction. In one exemplary implementation, pads 810, 811 and 812 are transmitting in an input direction while pads 813, 814 and 815 are transmitting in an output direction.

Figure 12:
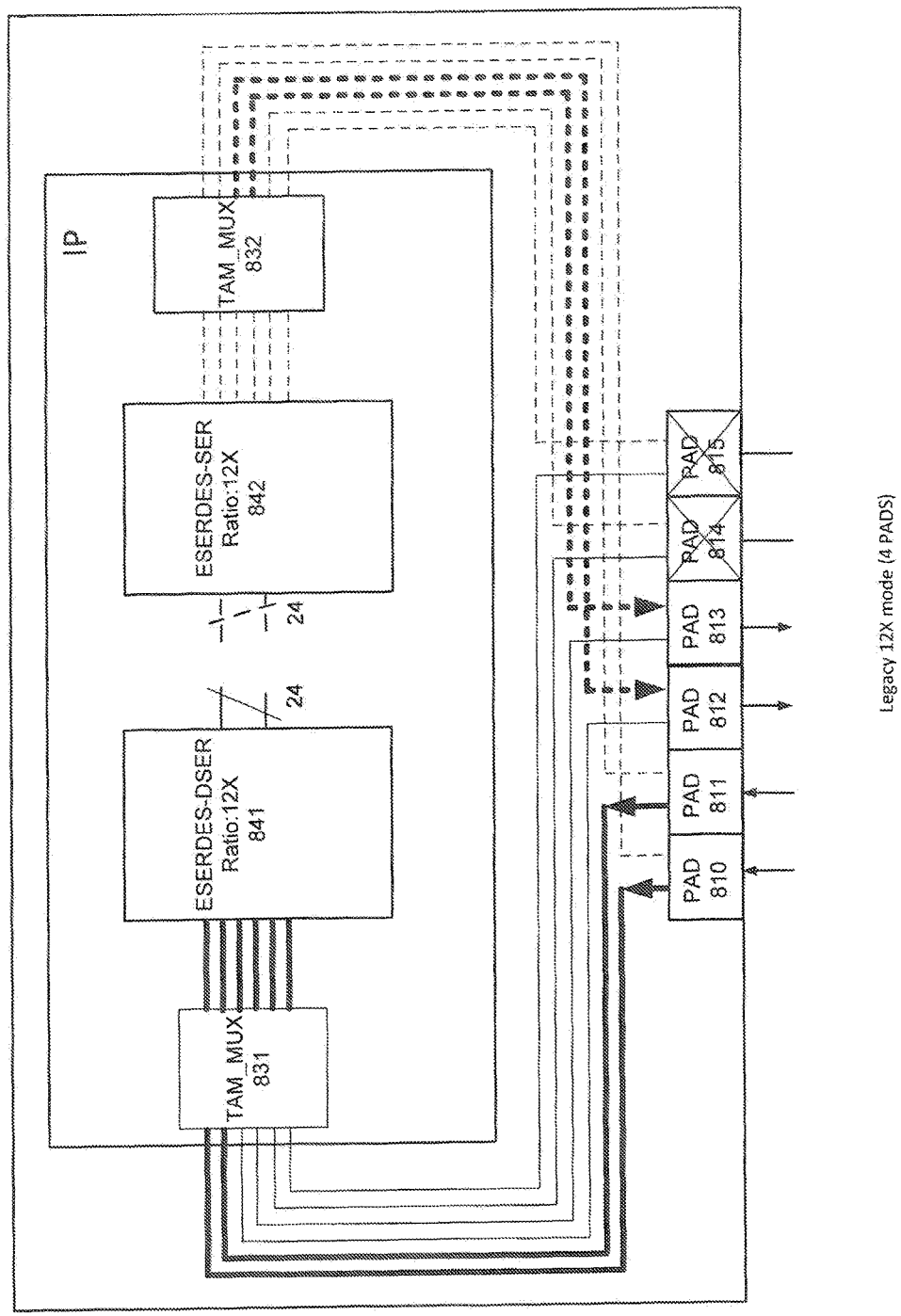
FIG. 12 is a block diagram of an exemplary Legacy 12× mode pin transmission direction in accordance with one embodiment when 4 pads are available.

FIG. 12 is a test partition diagram of a legacy 12× mode pin transmission directions in accordance with one embodiment with 4 pads available. In one embodiment, some of the pads are transmitting in an input direction and some of the pads are transmitting in an output direction. In one exemplary implementation, pads 810 and 811 are transmitting in an input direction while pads 812 and 813 are transmitting in an output direction. In one embodiment, pads 814 and 815 may not be available due to reduced pin requirements.

Figure 13:
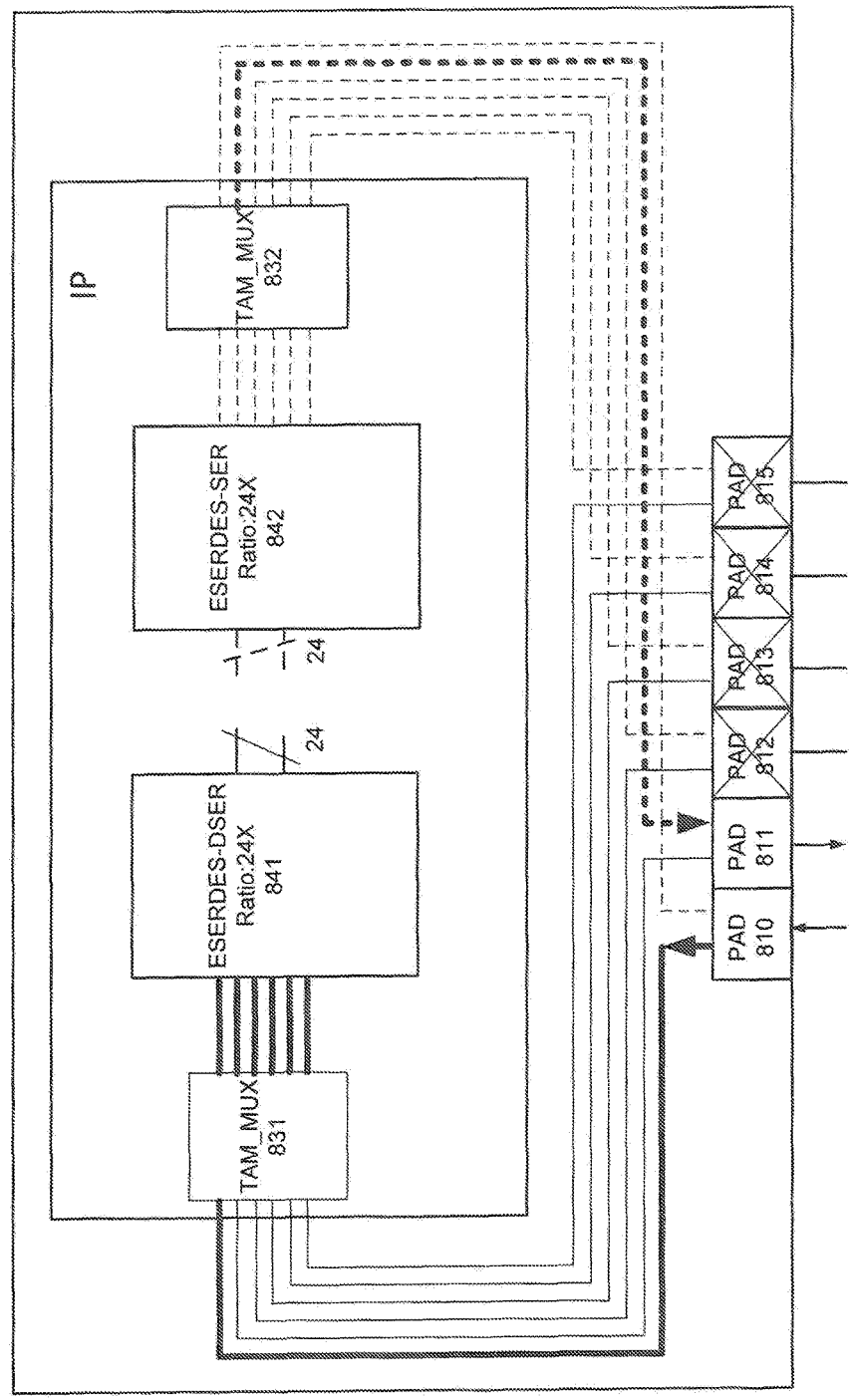
FIG. 13 is a block diagram of an exemplary Legacy 24× mode pin transmission direction in accordance with one embodiment when 2 pads are available.

FIG. 13 is a test partition diagram of legacy 24× mode pin transmission directions in accordance with one embodiment with 2 pads available. In one embodiment, some of the pads are transmitting in an input direction and some of the pads are transmitting in an output direction. In one exemplary implementation, pads 810 is transmitting in an input direction while pads 811 is transmitting in an output direction.

It is appreciated there are a number of differences between a test link I/O system and method and conventional attempts. In one embodiment the TESTLINK IO subsystem is a standardized interface that decouples the test interface design from the test partition whereas conventional test interfaces were tightly coupled with test partitions. The standardized interface can reduce or eliminate the need to redo test interface design every time a test partition changes in a design cycle. Test link I/O subsystem can be implemented earlier in the design phase (RTL) than conventional approaches which in turn can enables faster verification than traditional approaches. Traditional approaches typically require dedicated test input and test output pins whereas a test link I/O subsystem can use the same set of pins for "test input" and "test output" reducing pin requirement by half.

This allows use of "Low cost testers" and "Multi site testing" with in turn reducing test time and test cost. Low pin count test can be essential for 2.5D and 3D (HBM/TSV) designs which can be pin limited. The lower pin count can also facilitate reduction of wire or trace connections. The several characteristics of the test link I/O can in turn reduce time to market, engineering hours and tool resources otherwise expended by traditional approaches. A test link I/O subsystem can also be utilized together with other features (e.g., a Dynamic Standard Test Access, Granular Dynamic Clock System, an Ultra Fast Interface, etc.) to facilitate reuse of test partition and pattern data across different chips and enable concurrent testing of multiple test partitions.

Flexible Scan Interface Usage

In one exemplary implementation, FSSD modules are used with a test link I/O interface IO Subsystem to enable concurrent testing of test partitions in a chip. These FSSD modules can be used for various test architectures such as legacy scan mode, combinational scan compression mode, sequential scan compression mode, and online logic test at system level using sequential scan compression. In order to be compliant with one exemplary implementation of FSSD module, the test link I/O interface IO subsystem has a maximum of 6 scan data pins and an additional test control pin (e.g., a UFI pin) per test partition. A 24 slow scan data PSIs is connected to the test controller and compression/decompression logic (CODECs), and 24 slow scan data PSOs to observe response data from CODECs.

FIG. 14A is a block diagram of an exemplary use of FSSD modules at varying test partition levels in accordance with one embodiment. Each test partition is split into smaller test blocks or partitions. Each partition includes a FSSD load test partition (deserializer). In one embodiment of the scan compression mode, information from six scan-in pins at the test partition level is broadcasted to multiple partitions. Partitions are grouped into six test segments. Segments can have different number of partitions. In each segment, partition MISRs are daisy chained during misr_unload operation. The first partition in the daisy chain is called the head. In one exemplary implementation, each segment carries four such daisy chains to the test partition level test controller. Hence, the combined number of chains reaching the controller is 24 (6 segments, 4 chains each). The central controller includes a FSSD unload module or serializer. Depending on the available chip level pins, the incoming data is unloaded through one to six pads. In this usage, test partition and the corresponding test patterns generated at the test partition level can be reused. Pattern-reuse can be achieved by minimal re-formatting to be suitable for another bandwidth ratio.

Figure 14B:
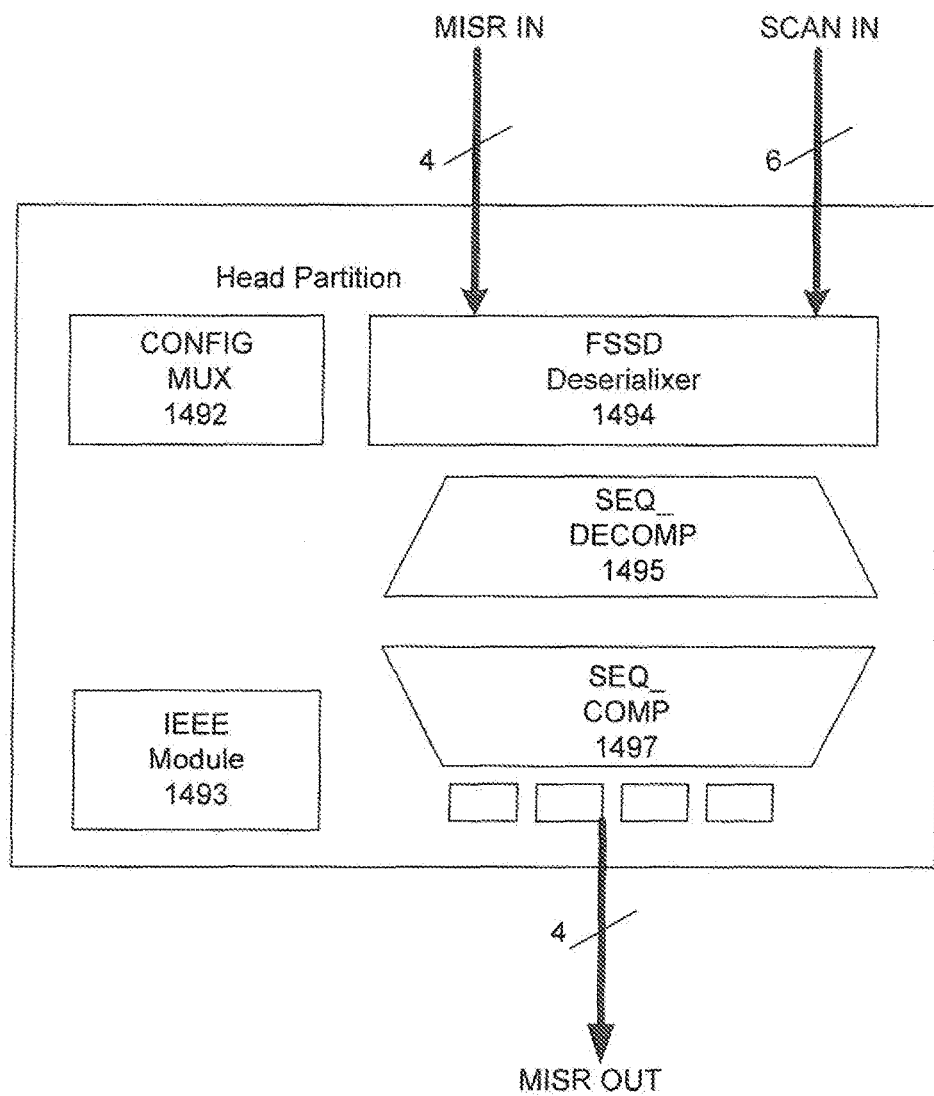
FIG. 14B is a block diagram of an exemplary test partition in accordance with one embodiment.

FIG. 14B is a block diagram of an exemplary test partition 1491 in accordance with one embodiment. In one exemplary implementation, test partition 1491 is similar to test partitions in FIG. 14A (e.g., test partitions 1404, 1412, 1451, etc.). The test partition 1491 includes a configuration MUX 1492 (e.g., a TAM MUX, etc.), IEEE 1500 module 1493, FSSD deserializer 1494, sequential decompressor 11495, sequential compressor 1497. Test partition 1491 has four MISR input signals, 6 scan input signals, and four MISR output signals.

Figure 15:
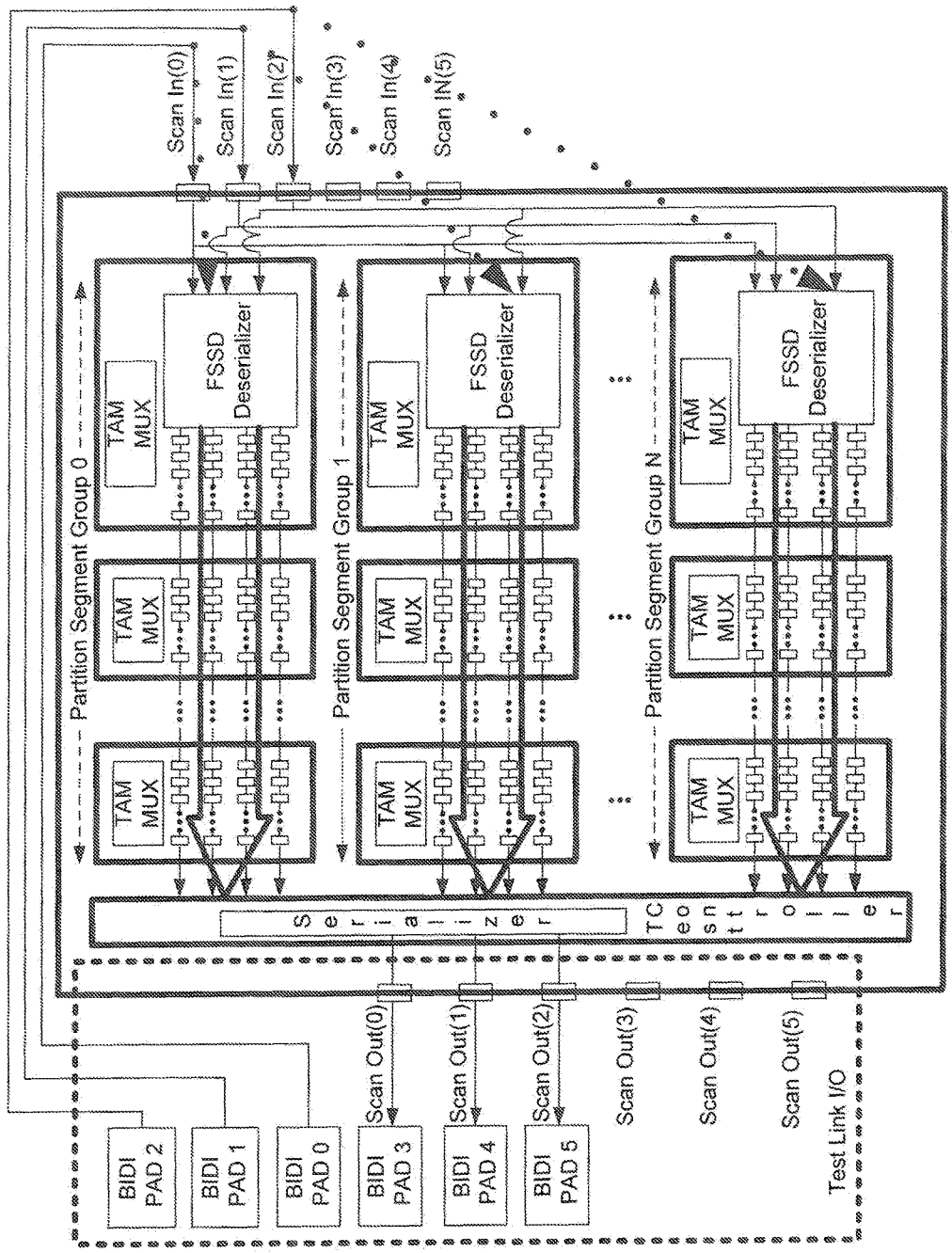
FIG. 15 is block diagram of an exemplary use of FSSD modules at varying test partition levels where internal test partition connections are shown in more detail.

FIG. 15 is block diagram of an exemplary use of FSSD modules in bypass compression mode at varying test partition levels where internal test partition connections are shown in more detail. Note that only used connections are shown in accordance with one embodiment. Each partition segment creates multiple partition concatenated chains. In one exemplary implementation, 24 legacy scan chains are driven from FSSD load modules located in the head partition of each segment. These 24 long chains are observed using the FSSD unload module or serializer that resides in the central test controller. FSSD load modules in each partition and the central unload module runs at the same bandwidth ratio. In one embodiment, different bandwidth ratios for the load module and the unload module are not supported because both share the same fast and slow clocks. In one exemplary implementation, EDA tools do not support the different bandwidth ratios on load and unload side. While reusing this test partition, if the number of chip pads available is limited (e.g., two SSI and two SSO, etc.) the bandwidth ratio can be changed to 12× by increasing the fast clock frequency. This allows the internal data to be at same slow clock speed, but external data rate can be faster. The test patterns generated using 8× mode can be reused by re-formatting into 12× mode without regenerating the patterns.

It is appreciated that granular dynamic test systems and methods can be coordinated with other test system operations. In one embodiment, Scan Serializer/Deserializer (SSD) is a time-division demultiplexing/multiplexing based scan architecture. It uses a small number of pins that interface with ATE and shift serial scan data at higher speeds. Load blocks or deserializers, are used before sending this data to Pseudo Scan Inputs (PSIs) at a lower frequency. Similarly Pseudo Scan Outputs (PSOs) send the scan data to unload blocks or serializers, before it reaches top level pins. In one exemplary implementation of an N:1 SSD ratio, an SSD fast clock runs at N times the speed of internal shift frequency.

With reference back to FIG. 2, in one embodiment, operations within a component of system 200 can be coordinated with various other components and features of system 200, external interfaces and components within a test partition. In one embodiment, a UFI and test clock generation is coordinated with DSTA serialization and deserialization operations.

Additional information regarding a Ultra Fast Interface (UFI) is set forth in related co-pending application Ser. No. 15/336,716, entitled Granular Dynamic Test Systems and Methods filed on Oct. 27, 2016, which is incorporated herein by reference.

Additional information regarding DSTA is set forth in related co-pending application Ser. No. 15/336,736, entitled Dynamic Scan Test Access (DSTA) filed on Oct. 27, 2016, which is incorporated herein by reference.

Additional information regarding coordination of external pad configuration is set forth in related co-pending application Ser. No. 15/336,687, entitled Test Partition External Input/Output Interface Control filed on Oct. 27, 2016, which is incorporated herein by reference.

Additional information regarding on-line test operations and JTAG test operations is set forth in related co-pending application Ser. No. 15/336,747, entitled Scan System Interface (SSI) filed on Oct. 27, 2016, which is incorporated herein by reference.

Additional information regarding free running clock and independent test partition clock coordination is set forth in related co-pending application Ser. No. 15/336,626, entitled Dynamic Independent Test Partition Clocks filed on Oct. 27, 2016, which is incorporated herein by reference.

Additional information regarding test partition clock staggering and peak power reduction is set forth in related co-pending application Ser. No. 15/336,676, entitled Independent Test Partition Clock Coordination Across Multiple Test Partitions filed on Oct. 27, 2016, which is incorporated herein by reference.

The granular dynamic test systems and methods can be used in a variety of applications (e.g., CPUs, GPUs, mobile device SoCs, etc.). The granular dynamic test systems and methods can be used for both production testing and on-line testing. The production testing can be directed to finding manufacturing defects and the on-line testing can be directed to finding errors that develop after product shipment. The granular dynamic testing systems and methods support testing features for external testing (e.g., testing with Automatic Test Equipment (ATE)) as well as on system internal testing.

A granular dynamic test system and method can allow parallel testing of multiple test partitions in a given SoC. It also enables greater multi-site testing opportunities to further lower the test cost. The flexible and dynamic scan interface architecture enables reuse of test-data for a given test partition across SoCs with different scan pin configurations.

Conclusion

Thus, the present systems and methods facilitate enhanced test link I/O interface an efficient and effective manner. Nonstandardized test interfaces between test partitions and top level SoC pads can limit test pattern reuse when fewer pads are available in other SoCs for the same test partition. The flexible and dynamic scan interface architecture decouples the scan pin requirements from the design cycle and enables reuse of test-data for a given test partition across SoCs with different scan pin configurations. In one embodiment, the scan test interface needs a maximum of seven pads per test partition and it can work with as few as two pads.

Some portions of the detailed descriptions are presented in terms of procedures, logic blocks, processing, and other symbolic representations of operations on data bits within a computer memory. These descriptions and representations are the means generally used by those skilled in data processing arts to effectively convey the substance of their work to others skilled in the art. A procedure, logic block, process, etc., is here, and generally, conceived to be a self-consistent sequence of steps or instructions leading to a desired result. The steps include physical manipulations of physical quantities. Usually, though not necessarily, these quantities take the form of electrical, magnetic, optical, or quantum signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are associated with the appropriate physical quantities and are merely convenient labels applied to these quantities. Unless specifically stated otherwise as apparent from the following discussions, it is appreciated that throughout the present application, discussions utilizing terms such as "processing", "computing", "calculating", "determining", "displaying" or the like, refer to the action and processes of a computer system, or similar processing device (e.g., an electrical, optical, or quantum, computing device), that manipulates and transforms data represented as physical (e.g., electronic) quantities. The terms refer to actions and processes of the processing devices that manipulate or transform physical quantities within a computer system's component (e.g., registers, memories, other such information storage, transmission or display devices, etc.) into other data similarly represented as physical quantities within other components.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents. The listing of steps within method claims do not imply any particular order to performing the steps, unless explicitly stated in the claim.

The invention claimed is:

1. A chip test system comprising:
a test partition configured to perform test operations;
a centralized test controller for controlling testing by the test partition; and
a test link interface controller configured to communicate between the centralized test controller and the test partition, wherein the test link interface controller controls dynamic changes to external pads associated with the test operations, wherein the test link interface controller comprises a pin direction controller that generates direction control signals based on the state of a local test controller and communicates the desired direction to a boundary scan cell associated with the pin.

2. The chip test system of claim 1, wherein the test link interface controller dynamically selects between an input direction and output direction for the external pads.

3. The chip test system of claim 1, wherein the boundary scan cell programs the pad to either an input or an output direction depending on the direction control signals.

4. The chip test system of claim 1, wherein the input direction corresponds to driving test data and the output direction corresponds to observing test data.

5. The chip test system of claim 1, wherein test control and test output connections are pipelined similarly so that test data and control are in sync and connections in a test link interface and external pads switch to an indicated direction by the time input/output data is ready.

6. The chip test system of claim 1, wherein an TO subsystem of the test link interface is dedicated to a partition.

7. A chip test system comprising:
   a plurality of functional components arranged in test partitions;
   a plurality of scan test chains configured to perform testing of the plurality of functional components, wherein plurality of scan test chains utilize a first set of test signal connections;
   a centralized test controller for controlling testing by the scan test chains; and
   a test link interface configured to coordinate communication between the centralized test controller and external bi-directional pads, wherein the test link interface controller dynamically selects between an input direction and output direction for the external bi-directional pads.

8. The chip test system of claim 7, wherein the connections are implemented in RTL as they are predetermined and decoupled from a generic design that is reused for the test partitions, wherein the implementation in RTL enables earlier verification in a design cycle phase than a single direction dedicated external pad design.

9. The chip test system of claim 7, wherein an Input/Output (TO) subsystem of the test link interface is a dedicated point-to-point test link to at least one of the test partitions.

10. The chip test system of claim 7, wherein an Input/Output (TO) subsystem of the test link interface includes a shared link between multiple test partitions.

11. The system of claim 7, wherein the fast interface comprises single pin control for at least one of the test partitions, wherein the test partition includes a test pipeline and dynamic standard test access.

12. The system of claim 7, wherein the test link interface is a standard and consistent interface for the test partitions within a single chip and across multiple chips.

* * * * *